(12) United States Patent
Lin et al.

(10) Patent No.: US 10,630,277 B2
(45) Date of Patent: *Apr. 21, 2020

(54) FET DRIVING CIRCUIT

(71) Applicant: TDK CORPORATION, Tokyo (JP)

(72) Inventors: Min Lin, Tokyo (JP); Ken Matsuura, Tokyo (JP)

(73) Assignee: TDK CORPORATION, Tokyo (JP)

( * ) Notice: Subject to any disclaimer, the term of this patent is extended or adjusted under 35 U.S.C. 154(b) by 117 days.

This patent is subject to a terminal disclaimer.

(21) Appl. No.: 16/017,121

(22) Filed: Jun. 25, 2018

(65) Prior Publication Data

US 2018/0375504 A1  Dec. 27, 2018

(30) Foreign Application Priority Data

Jun. 26, 2017 (JP) .................................. 2017-124338

(51) Int. Cl.
*H03K 17/687* (2006.01)
*H03K 17/0416* (2006.01)
(Continued)

(52) U.S. Cl.
CPC ........ *H03K 17/04163* (2013.01); *H02M 1/38* (2013.01); *H03B 5/1203* (2013.01);
(Continued)

(58) Field of Classification Search
CPC ....... H03K 17/04163; H03K 17/04123; H03K 2217/0036; H03K 2217/009; H02M 1/38; H03B 5/1203; H03F 2203/00
(Continued)

(56) References Cited

U.S. PATENT DOCUMENTS 5,929,598 A * 7/1999 Nakama ................. H02J 50/12
320/108
9,948,289 B2 * 4/2018 Leong .................. H03K 17/163
(Continued)

FOREIGN PATENT DOCUMENTS

JP   2007-501544   1/2007
WO   2005/013487   2/2005

OTHER PUBLICATIONS

Pilawa-Podgurski et al., "Very-High-Frequency Resonant Boost Converters", IEEE Transactions on Power Electronics, Jun. 2009, pp. 1654-1665, vol. 24, No. 6.

*Primary Examiner* — Ryan Jager
(74) *Attorney, Agent, or Firm* — Greenblum & Bernstein, P.L.C.

(57) ABSTRACT

A FET driving circuit includes: inputs into which a DC voltage is inputted; outputs connected to gate and source electrodes of a FET; a switch; a capacitance connected across the switch; and an LC resonance circuit connected in series with the switch across the inputs. A voltage generated across the switch during switching is outputted to drive the FET. The LC resonance circuit has a first connector connected to one input and a second connector connected to the switch, and is configured with a path including an inductance and a path including an inductance and a capacitance. An impedance between the first and second connectors has two resonant frequencies. The impedance has a local maximum at the lower resonant frequency, which is higher than a switching frequency, and a local minimum at the higher resonant frequency, which is around double the switching frequency.

16 Claims, 7 Drawing Sheets

(51) Int. Cl.
*H03K 17/0412* (2006.01)
*H02M 1/38* (2007.01)
*H03B 5/12* (2006.01)

(52) U.S. Cl.
CPC ... *H03K 17/04123* (2013.01); *H03F 2203/00* (2013.01); *H03K 2217/009* (2013.01); *H03K 2217/0036* (2013.01)

(58) Field of Classification Search
USPC .......................................................... 327/427
See application file for complete search history.

(56) References Cited

U.S. PATENT DOCUMENTS

| | | | | |
|---|---|---|---|---|
| 2016/0087481 | A1* | 3/2016 | Jiang | H02J 50/10 320/108 |
| 2018/0375503 | A1* | 12/2018 | Lin | H03K 17/04123 |
| 2018/0375504 | A1* | 12/2018 | Lin | H03K 17/04163 |
| 2019/0089342 | A1* | 3/2019 | Spinella | H03K 17/687 |

* cited by examiner

F I G. 8
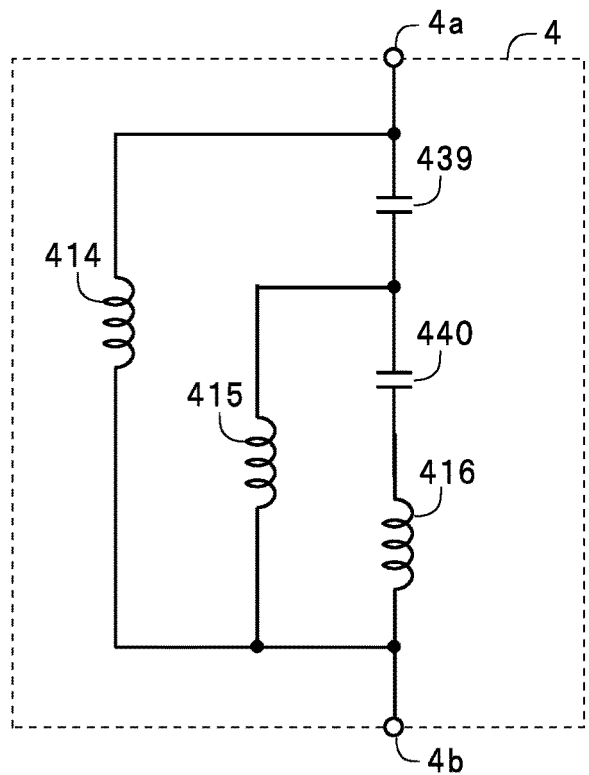
F I G. 9
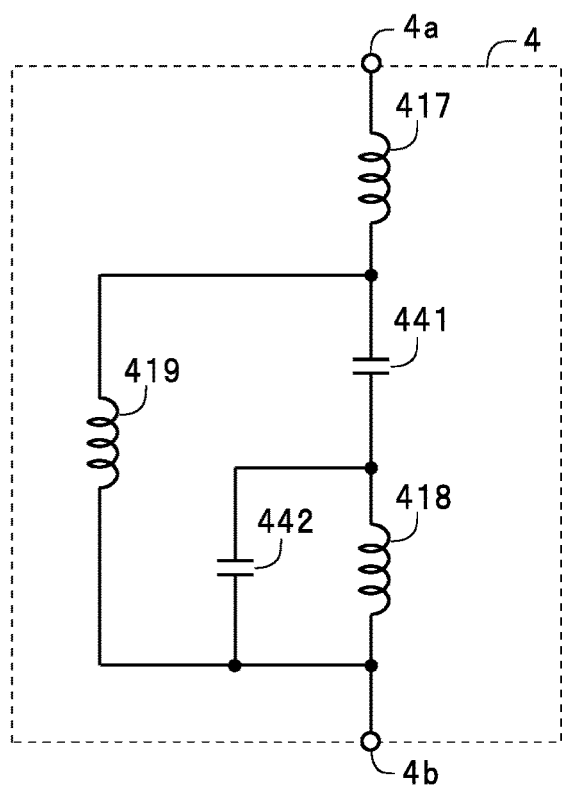

FET DRIVING CIRCUIT

FIELD OF THE INVENTION

The present invention relates to a FET (Field Effect Transistor) driving circuit that drives a FET used as a switching element, such as a converter, an inverter, or a switching power supply.

DESCRIPTION OF THE RELATED ART

A resonant FET driving circuit is well known as a FET driving circuit for driving a FET (for example, a MOSFET) at a high switching frequency (see Non-Patent Literature 1 (Very-High-Frequency Resonant Boost Converters, IEEE TRANSACTIONS ON POWER ELECTRONICS, VOL.24, NO. 6, JUNE 2009, PP 1654-1665) and Patent Literature 1 (Japanese Translation of PCT International Publication No. 2007-501544)).

Non-Patent Literature 1 discloses a self-excited FET driving circuit which, as depicted in FIG. 5 of the cited document, includes a switch element (MOSFET) connected between the gate electrode and the source electrode of the FET to be driven and an LC resonance circuit that is connected to the gate electrode of the FET to be driven and functions as a load network for the switch element. This FET drive circuit is capable of outputting a trapezoidal resonant gate driving voltage to the FET.

Patent Literature 1 discloses a FET driving circuit equipped with an inductor that is connected at a first end to the gate electrode of the FET to be driven, a first switch that is connected between a first end of a power supply that outputs a power supply voltage and a second end of the inductor, a third switch that is connected between the first end of the power supply and the first end of the inductor, a second switch that is connected between the second end of the power supply that is grounded and the second end of the inductor, and a fourth switch that is connected between the second end of the power supply and the first end of the inductor. In this FET driving circuit, by driving the four switches with the timing depicted in FIG. 3 of the cited document, the inductor is precharged, and by doing so, it is possible to charge and discharge the gate capacitance of the FET to be driven at high speed (that is, the gradient is set steeper than the voltage gradient of the gate-source voltage, or in other words, the respective times taken by the voltage to rise and fall are shortened).

SUMMARY OF THE INVENTION

However, since the FET driving circuit in Non-Patent Literature 1 described above is self-excited, there is the problem that the design is complex and a further problem in that the switching frequency fluctuates. Also, since an LC resonance circuit that suppresses the second harmonic component is distributed independently of the components in the driving circuit, there is a problem that the wiring of the mounting pattern has an increased influence when a switching driving operation is performed at high frequency, and due to this influence, there are problems in that it becomes difficult to optimize and stabilize resonant driving operations. There are also further problems in that it is difficult to reduce the cost of mounting components (i.e., to reduce the manufacturing cost), to minimize the component mounting area (i.e., to miniaturize the device), and to make adjustments to optimize the operation of the device as a whole. On the other hand, although the FET driving circuit according to Patent Literature 1 mentioned above is externally excited and therefore does not have the problems with the FET driving circuit according to Non-Patent Literature 1 described above (the problems of being complex to design and the switching frequency fluctuating), the FET driving circuit according to Patent Literature 1 requires four switches, which increases the cost of circuitry and since dead time needs to be set to prevent cross conduction, it is difficult to increase the operating frequency.

The present invention was conceived in view of the problems described above and has a principal object of providing a FET driving circuit that can greatly increase the voltage gradients of rises and falls in a driving waveform supplied to the gate electrode of a FET to be driven (that is, can reduce the time taken by rises and falls in the driving waveform), that has the advantages of a reduced component mounting cost (i.e., a reduced manufacturing cost) and a reduced component mounting area (i.e., miniaturization of the device) by reducing the number of switches while avoiding fluctuations in the switching frequency, and that is capable of operating at high frequency with a lower loss.

To achieve the stated object, a FET driving circuit according to the present invention comprises: two direct current (DC) input terminals that are positive and negative and into which a DC voltage is inputted; two output terminals connected to a gate electrode and a source electrode of a FET to be driven; a switch with two ends; a resonant capacitance connected across both ends of the switch; and an LC resonance circuit connected in series with the switch across the DC input terminals, wherein a voltage generated across both ends of the switch during a switching operation is outputted across the two output terminals as a driving voltage for the FET, the LC resonance circuit has a first connector that is connected to one DC input terminal out of the two DC input terminals and a second connector that is connected to the switch, the LC resonance circuit is configured as a single-terminal-pair network in which a current path including an inductance and a current path including a series circuit composed of an inductance and a capacitance are formed between the first connector and the second connector, in the LC resonance circuit, frequency characteristics of an impedance between the first connector and the second connector have two resonant frequencies, a first resonant frequency that is a lower frequency out of the two resonant frequencies is higher than a switching frequency of the switch and the impedance has a local maximum at the first resonant frequency, and a second resonant frequency that is a higher frequency out of the two resonant frequencies is around double the switching frequency and the impedance has a local minimum at the second resonant frequency.

Here, the LC resonance circuit internally includes a first inductance, a second inductance, and a first capacitance, wherein the first inductance is connected between the first connector and the second connector, and the second inductance and the first capacitance are connected in series between the first connector and the second connector.

Alternatively, the LC resonance circuit may internally include a third inductance, a fourth inductance, and a second capacitance, wherein the third inductance and the fourth inductance are connected in series between the first connector and the second connector, and the second capacitance is connected in parallel to the fourth inductance.

In the FET driving circuit according to the present invention, the LC resonance circuit is configured so that the frequency characteristics of the impedance have a further two resonant frequencies that are higher than the second resonant frequency, the impedance has a local maximum at a third resonant frequency that is a lower frequency out of the further two resonant frequencies, a fourth resonant frequency that is a higher frequency out of the further two resonant frequencies is around four times the switching frequency, and the impedance has a local minimum at the fourth resonant frequency.

Here, the LC resonance circuit internally includes a fifth inductance, a sixth inductance, a seventh inductance, a third capacitance, and a fourth capacitance, wherein the fifth inductance is connected between the first connector and the second connector, the sixth inductance and the third capacitance are connected in series between the first connector and the second connector, and the seventh inductance and the fourth capacitance are connected in series between the first connector and the second connector.

Alternatively, the LC resonance circuit may internally include an eighth inductance, a ninth inductance, a tenth inductance, a fifth capacitance, and a sixth capacitance, wherein the eighth inductance, the ninth inductance, and the tenth inductance are connected in series between the first connector and the second connector, the fifth capacitance is connected in parallel to the ninth inductance, and the sixth capacitance is connected in parallel to the tenth inductance.

Alternatively, the LC resonance circuit may internally include an eleventh inductance, a twelfth inductance, a thirteenth inductance, a seventh capacitance, and an eighth capacitance, wherein the eleventh inductance, the twelfth inductance, and the thirteenth inductance are connected in order in series between the first connector and the second connector, the seventh capacitance is connected in parallel to a series circuit composed of the twelfth inductance and the thirteenth inductance, and the eighth capacitance is connected in parallel to the thirteenth inductance.

Alternatively, the LC resonance circuit may internally include a fourteenth inductance, a fifteenth inductance, a sixteenth inductance, a ninth capacitance, and a tenth capacitance, wherein the fourteenth inductance is connected between the first connector and the second connector, the ninth capacitance, the tenth capacitance, and the sixteenth inductance are connected in order in series between the first connector and the second connector, and the fifteenth inductance is connected in parallel to a series circuit composed of the tenth capacitance and the sixteenth inductance.

Alternatively, the LC resonance circuit may internally include a seventeenth inductance, an eighteenth inductance, a nineteenth inductance, an eleventh capacitance, and a twelfth capacitance, wherein the seventeenth inductance, the eleventh capacitance, and the eighteenth inductance are connected in order in series between the first connector and the second connector, the nineteenth inductance is connected in parallel to a series circuit composed of the eleventh capacitance and the eighteenth inductance, and the twelfth capacitance is connected in parallel to the eighteenth inductance.

Alternatively, the LC resonance circuit may internally include a twentieth inductance, a twenty-first inductance, a twenty-second inductance, a thirteenth capacitance, and a fourteenth capacitance, wherein the twentieth inductance, the thirteenth capacitance, and the twenty-first inductance are connected in order in series between the first connector and the second connector, and the twenty-second inductance and the fourteenth capacitance are respectively connected in parallel to a series circuit composed of the thirteenth capacitance and the twenty-first inductance.

In the FET driving circuit according to the present invention, the LC resonance circuit internally includes inductances that are magnetically coupled.

In the FET driving circuit according to the present invention, the switch performs a Class E switching operation.

In the FET driving circuit according to the present invention, a DC-cutting capacitance is connected to at least one of a path that connects one end of the switch and one output terminal out of the two output terminals and a path that connects another end of the switch and another output terminal out of the two output terminals.

Here, the DC-cutting capacitance may be connected to both of the path that connects the one end of the switch and the one output terminal out of the two output terminals and the path that connects the other end of the switch and the other output terminal out of the two output terminals.

In the FET driving circuit according to the present invention, a biasing circuit that applies a DC bias to the driving voltage is connected across the two output terminals.

According to the present invention, it is possible, by repeatedly switching a switch on and off in a FET driving circuit equipped with an LC resonance circuit with impedance characteristics including two resonant frequencies (a first resonant frequency and a second resonant frequency) or an LC resonance circuit with impedance characteristics including four resonant frequencies (a first resonant frequency to a fourth resonant frequency), to output a driving voltage for driving the FET to be driven across the output terminals. Here, by using an LC resonance circuit with these impedance characteristics, it is possible to attenuate a second harmonic component (or a second harmonic component and a fourth harmonic component) of a switching frequency in the voltage applied across both ends of the switch when the switch is off, and by doing so, it is possible to produce a waveform that is closer to a rectangular waveform. In this way, with this FET driving circuit, since it is possible to lower the voltage applied across both ends of the switch, it is possible to use a switch with a low withstand voltage and therefore a low on-resistance, which makes it possible to reduce the loss (conduction loss) of the driving circuit itself. At the same time, since it is possible to reduce the peak value of the gate driving voltage of the FET to be driven, it is possible to maintain a low derating for the gate voltage of the FET to be driven, which makes it possible to improve the reliability of the FET. Also, according to this FET driving circuit, it is possible to significantly shorten the time taken by the voltage applied across both ends of the switch to rise and fall (i.e., to significantly steepen the voltage gradients of rises and falls), which makes it possible to significantly reduce the switching loss of the driving circuit itself. At the same time, it is possible to significantly shorten the time taken by the gate driving voltage of the FET to be driven to rise and fall (i.e., to significantly steepen the voltage gradients of rises and falls), and since this makes it possible to significantly reduce the gate driving loss of the FET (i.e., to drive the FET with a significantly lower loss), it is possible to significantly reduce the switching loss and conduction loss at the FET. Also, according to this FET driving circuit, it is possible to reduce the driving loss due to current resonance between the input inductance and the input capacitance, which is the gate-source characteristics of a FET. Since a single switch is sufficient in this FET driving circuit, compared to a configuration that uses a larger number of switches, it is possible to avoid an increase in the cost of components, an increase in the mounting cost of components, and an increase in the mounting area of components, and to also realize a simplified circuit. Since no dead time is set to prevent cross conduction, it is also possible to drive the FET at even higher frequencies. Since an externally excited configuration is used, it is also possible to avoid fluctuations in the switching frequency. According to this FET driving circuit, since the amplitude of the voltage to drive the FET depends on the DC input voltage, by adjusting the DC input voltage, it is possible to freely adjust the amplitude of the voltage. In particular, when switching operations are performed at high frequency, various adverse effects will occur if the wiring paths of the patterns on which the high-frequency switching current flows are long. However, with a FET driving circuit that includes an LC resonance circuit with the impedance characteristics described above, it is easy to make the wiring paths extremely short and suppress the effects of noise, such as components being affected by noise or conversely emitting noise. By integrating the components, it is possible to suppress differences in the fluctuations in element characteristics, which contributes to making operations more stable. It is also possible to reduce the manufacturing cost, to miniaturize the device, and optimize the operation of the device.

It should be noted that the disclosure of the present invention relates to a content of Japanese Patent Application 2017-124338 that was filed on 26 Jun. 2017 and the entire content of which is herein incorporated by reference.

BRIEF DESCRIPTION OF THE DRAWINGS

These and other objects and features of the present invention will be explained in more detail below with reference to the attached drawings, wherein:

FIG. 8 is a circuit diagram of the LC resonance circuit 4 according to a sixth specific example with optimized impedance characteristics Z that include four resonant frequencies;

FIG. 9 is a circuit diagram of the LC resonance circuit 4 according to a seventh specific example with optimized impedance characteristics Z that include four resonant frequencies;

DESCRIPTION OF THE PREFERRED EMBODIMENTS

Figure 1:
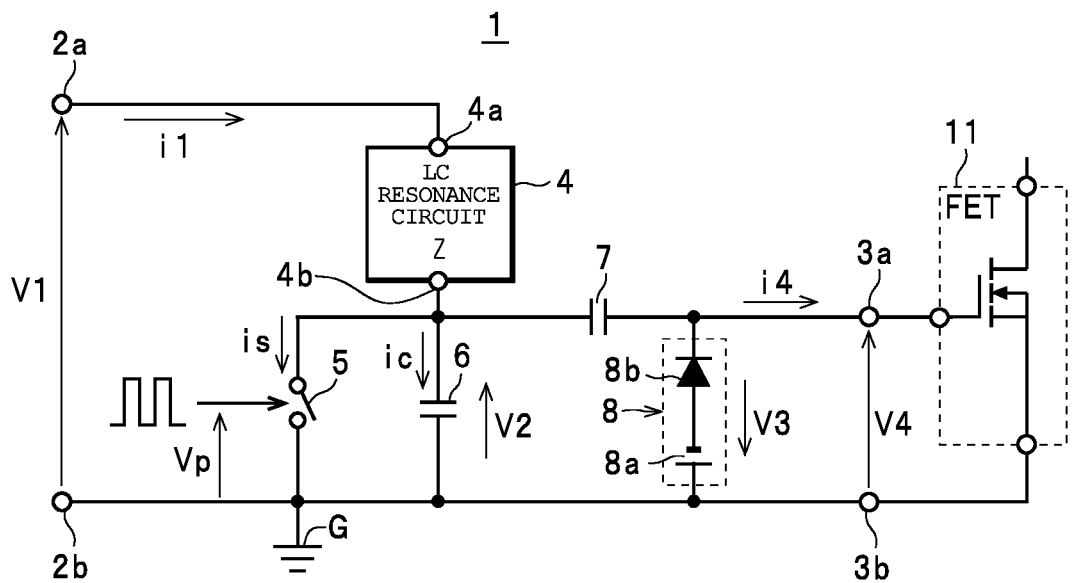
FIG. 1 is a diagram schematically depicting a circuit configuration of a FET driving circuit 1.

Several preferred embodiments of the present invention will now be described. Note that the present invention is not limited to the following embodiments. The component elements described below include equivalent component elements that should be apparent to those of skill in the art, and such component elements may be combined as appropriate.

The embodiments of the present invention will now be described in detail with reference to the drawings. Note that in the description of the drawings, elements that are the same have been assigned the same reference numerals and duplicated description thereof is omitted.

First, the configuration of a FET driving circuit 1 as one example of a FET driving circuit will be described with reference to FIG. 1.

The FET driving circuit 1 includes a pair of direct current (DC) input terminals 2a and 2b (hereinafter collectively referred to as the "DC input terminals 2" when no distinction is made), a pair of output terminals 3a and 3b (hereinafter collectively referred to as the "output terminals 3" when no distinction is made), an LC resonance circuit 4, a switch 5, a resonant capacitance 6, a DC-cutting capacitance 7 (hereinafter, simply "capacitance 7"), and a biasing circuit 8, and is configured so as to be capable of outputting a driving voltage V4 from the output terminals 3a and 3b to a FET (as one example, a MOSFET) 11 to be driven.

More specifically, a DC input voltage V1 is inputted across the pair of DC input terminals 2a and 2b with the DC input terminal 2b connected to a reference potential (in the present embodiment, the common ground G) as the low-potential side. The pulsed driving voltage V4 is outputted across the pair of output terminals 3a and 3b with the output terminal 3b, which is also connected to the reference potential, as a reference.

The switch 5 is constructed of a MOSFET, a bipolar transistor or the like. In the FET driving circuit 1, due to the switch 5 performing an on/off operation (i.e., a switching operation) in synchronization with a driving signal voltage Vp outputted from a control circuit, not illustrated (i.e., by using an externally-excited configuration), the DC input voltage V1 inputted from the DC input terminals 2 is converted to the driving voltage V4 and outputted from the output terminals 3.

The FET 11 is subject to be driven on/off by the switch 5, and due to the input characteristics of the FET 11, the series circuit, composed of the equivalent of an input inductance and an input capacitance (neither is shown) being present between the gate and the source of the FET 11, is a load that is responsive to the on/off switching of the switch 5. Also, the LC resonance circuit 4 with optimized impedance characteristics Z and the resonant capacitance 6 are loads that are responsive to the on/off switching of the switch 5.

The LC resonance circuit 4 is composed of a single-terminal-pair network (i.e., a two-terminal network) with two external connection terminals, namely a first connector 4a and a second connector 4b. Note that the LC resonance circuit 4 may be a combined resonance-impedance element as a single electronic component that is a two-terminal element configured by integrating an inductance and a capacitance that are internally provided.

The LC resonance circuit 4 has a current path composed of the equivalent of only an inductance (one example of "a current path that includes an inductance") provided in parallel with a current path that is composed of the equivalent of only a series circuit with an inductance and a capacitance (one example of "a current path including a series circuit with an inductance and a capacitance") across two connectors 4a and 4b. The LC resonance circuit 4 is formed so as to have the optimized impedance characteristics Z like those depicted in FIG. 2 as the frequency characteristics of the impedance when looking from the connectors 4a and 4b.

One connector (in the present embodiment, the connector 4a) out of the connectors 4a and 4b of the LC resonance circuit 4 is connected to the DC input terminal 2a and the other connector (in the present embodiment, the connector 4b) out of the connectors 4a and 4b is connected to one end of the switch 5. The other end of the switch 5 is connected to the DC input terminal 2b. Accordingly, when the switch 5 is on, a DC current loop composed of the DC input terminal 2a→the LC resonance circuit 4→the switch 5→the DC input terminal 2b is formed. The current loop described above is produced since the LC resonance circuit 4 is connected to the DC input terminal 2a on the positive side out of the DC input terminals 2a and 2b in FIG. 1, but it is also possible to connect the LC resonance circuit 4 to the DC input terminal 2b on the negative side, and the DC current loop for this configuration is DC input terminal 2a→the switch 5→the LC resonance circuit 4→the DC input terminal 2b.

In more detail, the frequency characteristics of the impedance (or the "optimized impedance characteristics Z") of the LC resonance circuit 4 are as follows. Depending on the circuit configuration of the LC resonance circuit 4, as depicted by the broken line in FIG. 2, it is possible to produce the optimized impedance characteristics Z which include, in order from the low frequency-side to the high frequency-side, a first resonant frequency and a second resonant frequency (i.e., two resonant frequencies), and as depicted by the solid line in FIG. 2, it is also possible to produce the optimized impedance characteristics Z which include, in order from the low frequency-side to the high frequency-side, a first resonant frequency, a second resonant frequency, a third resonant frequency, and a fourth resonant frequency (i.e., four resonant frequencies). In both of these optimized impedance characteristics Z, the first resonant frequency is higher than the switching frequency of the switch 5 and the second resonant frequency is around double the switching frequency of the switch 5. As mentioned above, the third resonant frequency and the fourth resonant frequency are in a higher frequency band than the second resonant frequency, and out of the third resonant frequency and the fourth resonant frequency, the fourth resonant frequency is around four times the switching frequency. The impedance has local maxima at the first resonant frequency and the third resonant frequency and local minima at the second resonant frequency and the fourth resonant frequency.

Figure 11:
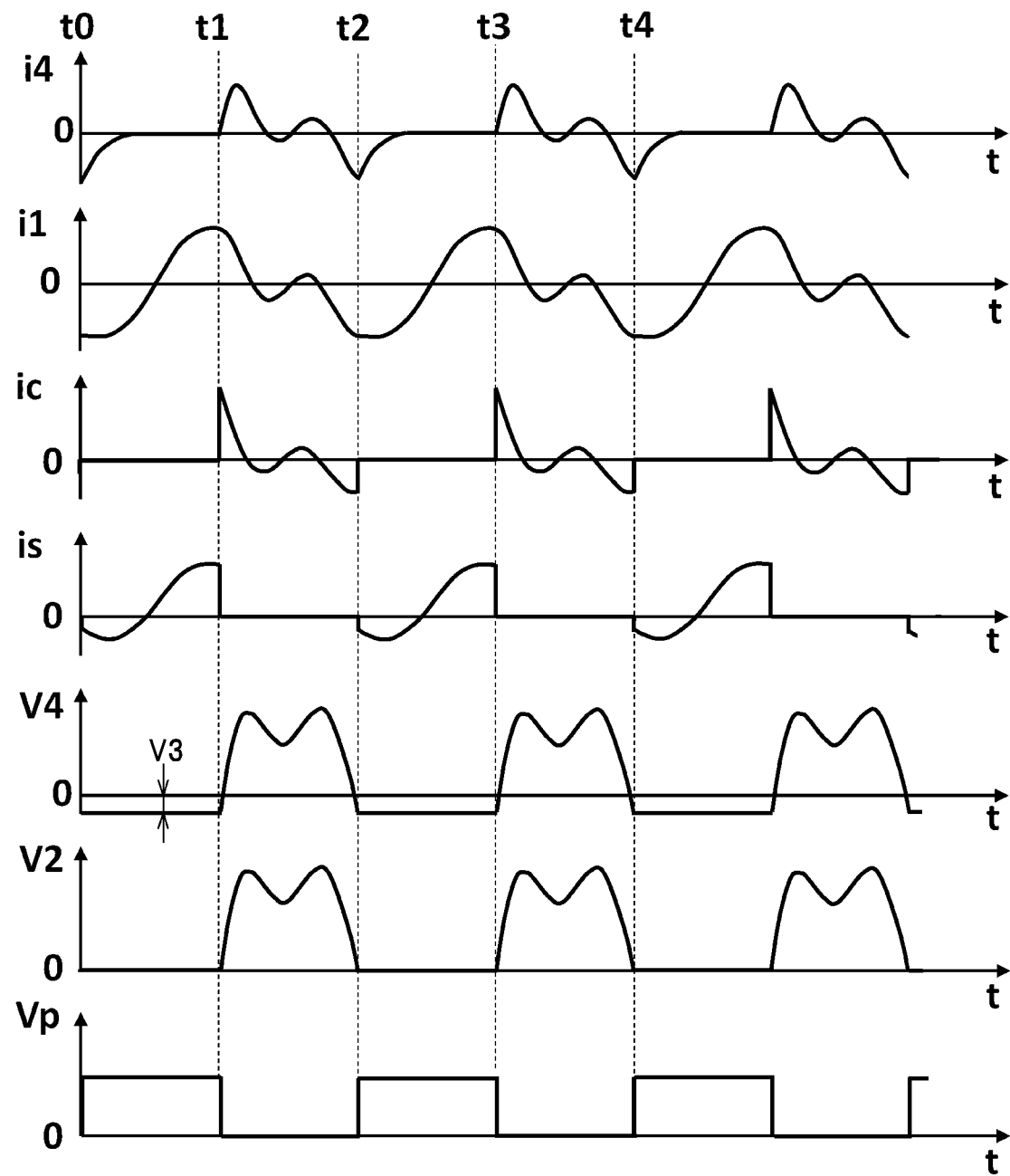
FIG. 11 is a waveform diagram useful in explaining the operation of a FET driving circuit 1 equipped with the LC resonance circuit 4 in either of FIG. 3 and FIGS. 4.
Figure 12:
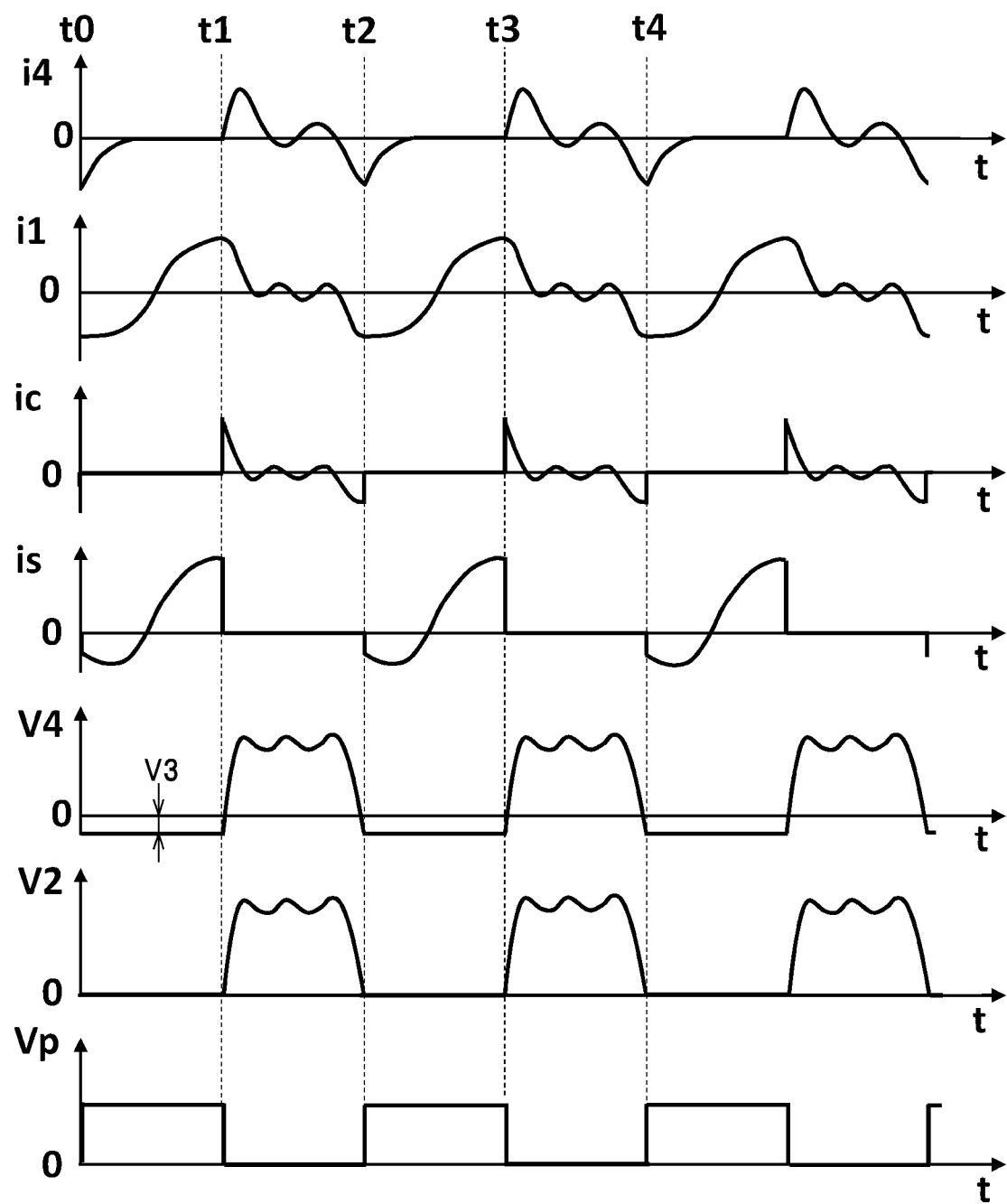
FIG. 12 is a waveform diagram useful in explaining the operation of a FET driving circuit 1 equipped with the LC resonance circuit 4 in any of FIG. 5 to FIG. 10.

Although a voltage V2 with the same frequency as the switching frequency is generated across both ends of the switch 5 during the off period, the impedance of the LC resonance circuit 4 has local minima at even-numbered multiples of (in the example described above, double, or double and four times) the switching frequency, which means that even-numbered components (in the examples described above, the second harmonic component or the second harmonic component and the fourth harmonic component) out of the harmonic components that construct the waveform of the voltage V2 generated across both ends of the switch 5 are attenuated by the LC resonance circuit 4. On the other hand, as described above, the LC resonance circuit 4 has local maxima at the first resonant frequency or at the first resonant frequency and the third resonant frequency, and due to this, odd-numbered components (mainly the third harmonic component) out of the harmonic components that construct the waveform of the voltage V2 are not attenuated in the same way as the base frequency component (the first harmonic component), and so remain. As a result, compared to a waveform, not illustrated, of the voltage V2 in which the second harmonic component is included (or the second harmonic component and the fourth harmonic component are included), the voltage V2 in which the second harmonic component is attenuated has a waveform which, as depicted in FIG. 11, is close to a rectangular waveform. Similarly, the voltage V2 in which the second harmonic component and the fourth harmonic component are attenuated has a waveform which, as depicted in FIG. 12, is close to a rectangular waveform. This means it is possible to suppress the voltage peak value (to around double the DC input voltage V1) and to reduce the time taken by voltage rises and falls (i.e., to steepen the voltage gradients of both rises and falls). As a result, as depicted in FIGS. 11 and 12, the voltage V2 applied across both ends of the switch 5 and the pulsed driving voltage V4 outputted from the output terminals 3 can have lower peak values and steeper rises and falls (i.e., the voltage gradients of rises and falls can be made steeper). Due to this, it is possible to use an element with a low withstand voltage and a low on-resistance as the switch 5, which makes it possible to reduce the conduction loss. The switching loss is also reduced, making it possible to enhance the low-loss effect of the driving circuit as a whole. Meanwhile, it is possible for the FET 11 being driven to maintain a low voltage derating at the gate electrode, and as a result, it is possible to improve the reliability of the FET 11. It is also possible to reduce the switching loss and conduction loss of the FET 11.

Next, specific examples of detailed circuit configurations of the LC resonance circuit 4 with the optimized impedance characteristics Z will be described with reference to FIGS. 3 to 10.

Figure 3:
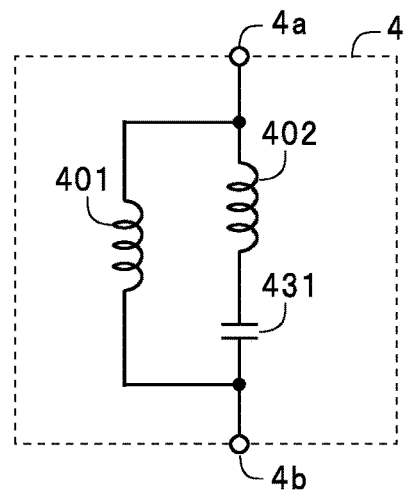
FIG. 3 is a circuit diagram of the LC resonance circuit 4 according to a first specific example with optimized impedance characteristics Z that include two resonant frequencies.

FIG. 3 depicts a first specific example of the LC resonance circuit 4 and has two resonant frequencies (i.e., a first resonant frequency and a second resonant frequency). This LC resonance circuit 4 includes a first inductance 401, a second inductance 402, and a first capacitance 431. The first inductance 401 is connected between the first connector 4a and the second connector 4b, and the second inductance 402 and the first capacitance 431 are connected in series between the connectors 4a and 4b.

Figure 4:
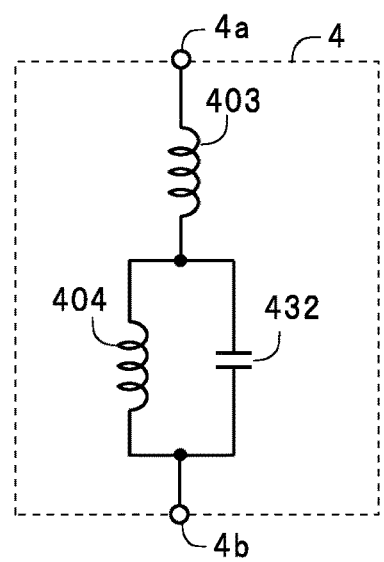
FIG. 4 is a circuit diagram of the LC resonance circuit 4 according to a second specific example with optimized impedance characteristics Z that include two resonant frequencies.

FIG. 4 depicts a second specific example of the LC resonance circuit 4 and has two resonant frequencies (i.e., a first resonant frequency and a second resonant frequency). This LC resonance circuit 4 includes a third inductance 403, a fourth inductance 404, and a second capacitance 432. The third inductance 403 and the fourth inductance 404 are connected in series between the first connector 4a and the second connector 4b, and the second capacitance 432 is connected in parallel to the fourth inductance 404.

Figure 5:
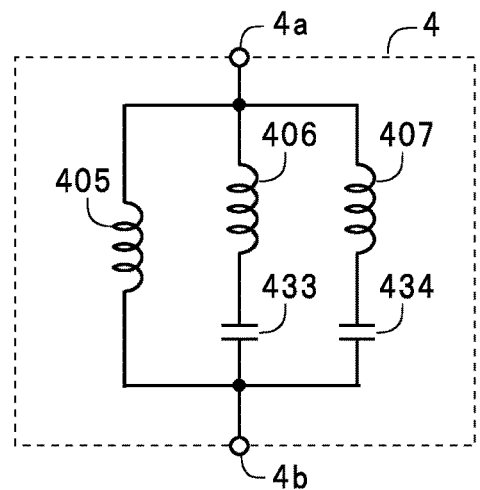
FIG. 5 is a circuit diagram of the LC resonance circuit 4 according to a third specific example with optimized impedance characteristics Z that include four resonant frequencies.

FIG. 5 depicts a third specific example of the LC resonance circuit 4 and has four resonant frequencies (i.e., a first resonant frequency to a fourth resonant frequency). This LC resonance circuit 4 includes a fifth inductance 405, a sixth inductance 406, a seventh inductance 407, a third capacitance 433, and a fourth capacitance 434. The fifth inductance 405 is connected between the first connector 4a and the second connector 4b, the sixth inductance 406 and the third capacitance 433 are connected in series between the connectors 4a and 4b, and the seventh inductance 407 and the fourth capacitance 434 are connected in series between the connectors 4a and 4b.

Figure 6:
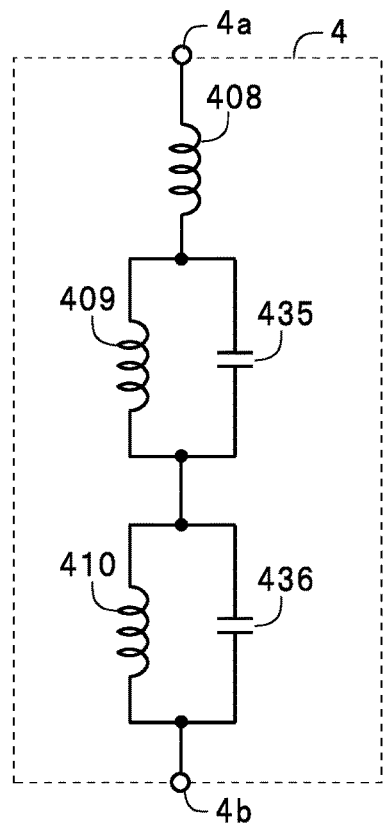
FIG. 6 is a circuit diagram of the LC resonance circuit 4 according to a fourth specific example with optimized impedance characteristics Z that include four resonant frequencies.

FIG. 6 depicts a fourth specific example of the LC resonance circuit 4 and has four resonant frequencies (i.e., a first resonant frequency to a fourth resonant frequency). This LC resonance circuit 4 includes an eighth inductance 408, a ninth inductance 409, a tenth inductance 410, a fifth capacitance 435, and a sixth capacitance 436. The eighth inductance 408, the ninth inductance 409, and the tenth inductance 410 are connected in series between the first connector 4a and the second connector 4b, the fifth capacitance 435 is connected in parallel to the ninth inductance 409, and the sixth capacitance 436 is connected in parallel to the tenth inductance 410.

Figure 7:
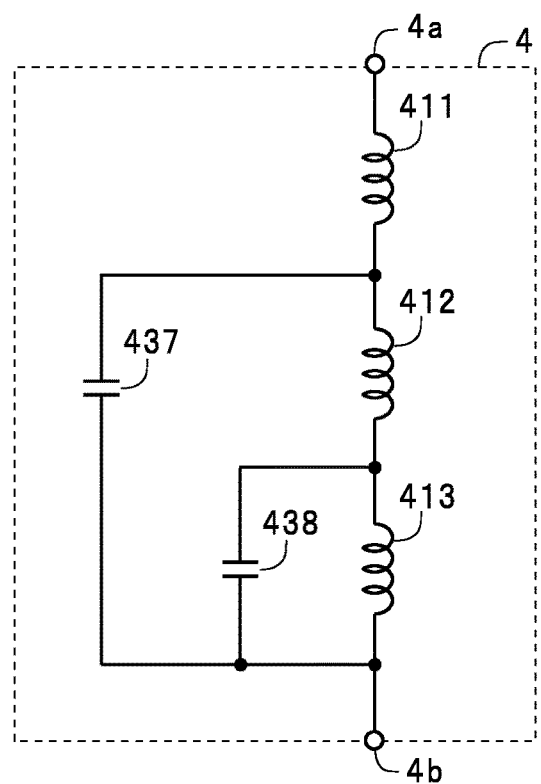
FIG. 7 is a circuit diagram of the LC resonance circuit 4 according to a fifth specific example with optimized impedance characteristics Z that include four resonant frequencies.

FIG. 7 depicts a fifth specific example of the LC resonance circuit 4 and has four resonant frequencies (i.e., a first resonant frequency to a fourth resonant frequency). This LC resonance circuit 4 includes an eleventh inductance 411, a twelfth inductance 412, a thirteenth inductance 413, a seventh capacitance 437, and an eighth capacitance 438. The eleventh inductance 411, the twelfth inductance 412 and the thirteenth inductance 413 are connected in that order in series between the first connector 4a and the second connector 4b, the seventh capacitance 437 is connected in parallel to a series circuit composed of the twelfth inductance 412 and the thirteenth inductance 413, and the eighth capacitance 438 is connected in parallel to the thirteenth inductance 413.

FIG. 8 depicts a sixth specific example of the LC resonance circuit 4 and has four resonant frequencies (i.e., a first resonant frequency to a fourth resonant frequency). This LC resonance circuit 4 includes a fourteenth inductance 414, a fifteenth inductance 415, a sixteenth inductance 416, a ninth capacitance 439, and a tenth capacitance 440. The fourteenth inductance 414 is connected between the first connector 4a and the second connector 4b, the ninth capacitance 439, the tenth capacitance 440, and the sixteenth inductance 416 are connected in that order in series between the connectors 4a and 4b, and the fifteenth inductance 415 is connected in parallel to a series circuit composed of the tenth capacitance 440 and the sixteenth inductance 416.

FIG. 9 depicts a seventh specific example of the LC resonance circuit 4 and has four resonant frequencies (i.e., a first resonant frequency to a fourth resonant frequency). This LC resonance circuit 4 includes a seventeenth inductance 417, an eighteenth inductance 418, a nineteenth inductance 419, an eleventh capacitance 441, and a twelfth capacitance 442. The seventeenth inductance 417, the eleventh capacitance 441, and the eighteenth inductance 418 are connected in that order in series between the first connector 4a and the second connector 4b, the nineteenth inductance 419 is connected in parallel to a series circuit composed of the eleventh capacitance 441 and the eighteenth inductance 418, and the twelfth capacitance 442 is connected in parallel to the eighteenth inductance 418.

Figure 10:
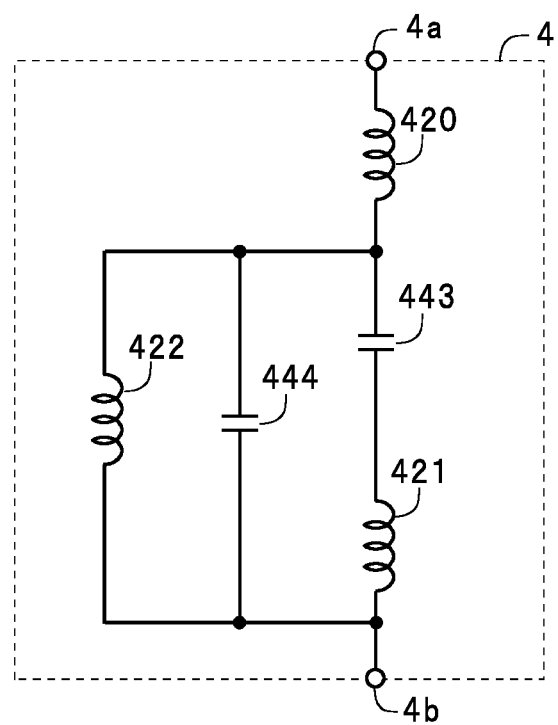
FIG. 10 is a circuit diagram of the LC resonance circuit 4 according to an eighth specific example with optimized impedance characteristics Z that include four resonant frequencies.

FIG. 10 depicts an eighth specific example of the LC resonance circuit 4 and has four resonant frequencies (i.e., a first resonant frequency to a fourth resonant frequency). This LC resonance circuit 4 includes a twentieth inductance 420, a twenty-first inductance 421, a twenty-second inductance 422, a thirteenth capacitance 443, and a fourteenth capacitance 444. The twentieth inductance 420, the thirteenth capacitance 443, and the twenty-first inductance 421 are connected in that order in series between the first connector 4a and the second connector 4b, and the twenty-second inductance 422 and the fourteenth capacitance 444 are separately connected in parallel to a series circuit composed of the thirteenth capacitance 443 and the twenty-first inductance 421.

The plurality of inductors provided inside the LC resonance circuit 4 may include inductors that are magnetically coupled. As one example, for the example circuit in FIG. 5, at least two out of the fifth inductance 405, the sixth inductance 406, and the seventh inductance 407 may be composed of inductors that are magnetically coupled to each other. By doing so, an LC resonance circuit that has a simple circuit configuration and has four resonant frequencies (the first resonant frequency to the fourth resonant frequency) is realized and at the same time the number of magnetic cores is reduced, which facilitates manufacturing at low cost and optimization. When there are fluctuations in the core characteristics of the inductor cores, it is also possible to suppress differences in fluctuations in the element characteristics of the individual inductors, which contributes to stabilization of operations.

The resonant capacitance 6 is a resonant capacitance for resonant switching that is connected to both ends of the switch 5. When the switch 5 is a semiconductor element, the resonant capacitance 6 may include the capacitance of junctions provided in the switch 5 (i.e., the output capacitance of the switch 5) and may be composed of only the capacitance of such junctions.

The capacitance 7 is connected on a path that connects both ends of the switch 5 and the output terminals 3a and 3b. In the FET driving circuit 1 in FIG. 1, as one example the capacitance 7 is connected on a path that connects one end of the switch 5 and the output terminal 3a by having one end of the capacitance 7 connected to one end of the switch 5 and the other end of the capacitance 7 connected to the output terminal 3a, but in place of this configuration, it is also possible to use a configuration where the capacitance 7 is connected on a path that connects the other end of the switch 5 and the output terminal 3b by having one end of the capacitance 7 connected to the other end of the switch 5 and the other end of the capacitance 7 connected to the output terminal 3b. Alternatively, the capacitance 7 may be connected to both of these paths. The capacitance 7 has a function (or "DC cutting function") that removes a DC component included in the voltage V2 that is generated during an off period of the switch 5 at one end of the switch 5 with the other end of the switch 5 (i.e., the common ground G) as a reference and outputs the resulting voltage.

The biasing circuit 8 applies a DC voltage (or "DC bias") V3 to the voltage V2 from which the DC component has been removed at the capacitance 7 as described above to generate the driving voltage V4. By doing so, as depicted in FIG. 11 and FIG. 12, the driving voltage V4 is generated as a voltage where the zero potential of the voltage V2, from which the DC component has been removed, is shifted by the DC voltage V3. As one example, although the biasing circuit 8 may be configured as depicted in FIG. 1 to include a DC power supply 8a that outputs the DC voltage V3 and a diode 8b that supplies the DC voltage V3 to the other end of the capacitance 7, the biasing circuit 8 is not limited to this configuration. Although the DC voltage V3 is supplied to the other end of the capacitance 7 in a state where the DC voltage V3 has been reduced by the forward voltage of the diode 8b, for ease of understanding, this forward voltage is ignored in the present embodiment (i.e., the forward voltage is assumed to be zero).

Figure 2:
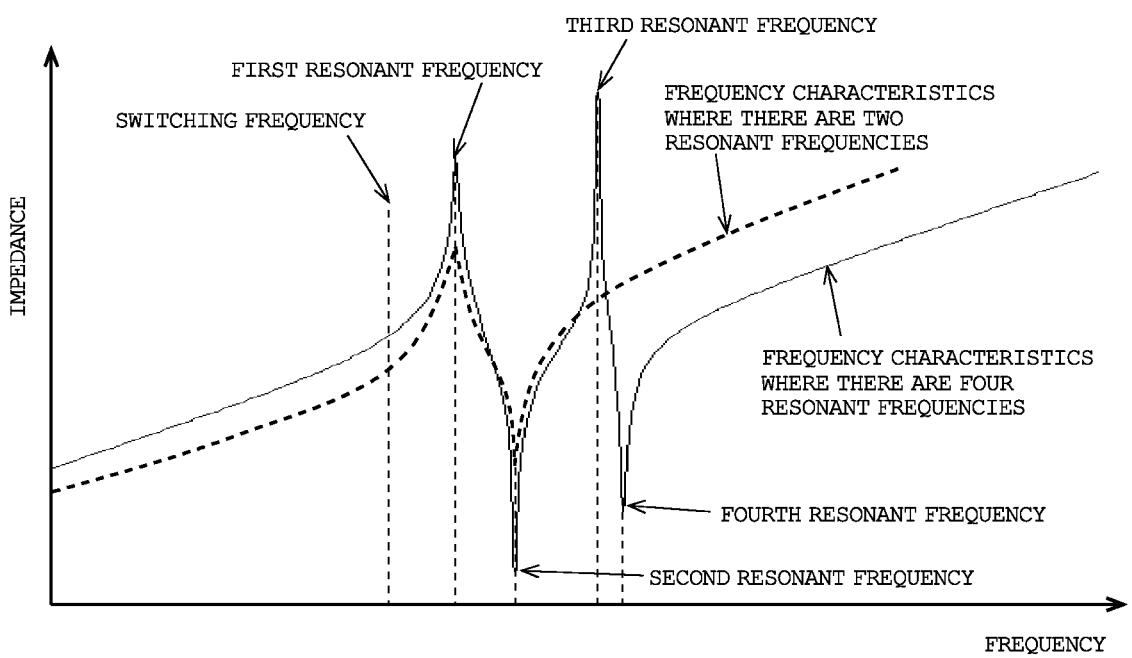
FIG. 2 is a diagram useful in explaining frequency characteristics when an LC resonance circuit 4 with optimized impedance characteristics Z has two resonant frequencies and when the LC resonance circuit 4 has four resonant frequencies.

Next, with reference to a steady-state operation waveform diagram given in FIG. 11, the fundamental operation of the FET driving circuit 1 depicted in FIG. 1 will be described in detail for the operation waveforms in each period for a case where the LC resonance circuit 4 has the optimized impedance characteristics Z with two resonant frequencies (i.e., the first resonant frequency and the second resonant frequency) depicted in FIG. 2.

Out of the operation waveforms in each period, the operations in the period from time t0 to time t1 are described first. At time t=t0, a driving signal voltage Vp outputted from a control circuit that performs on/off control of the switch 5 becomes a high level to turn the switch 5 on and this high level is maintained until time t=t1. Accordingly, in the period from time t0 to time t1, the switch 5 is on, the voltage V2 applied across both ends of the switch 5 is zero, and a current is that flows to the resonant capacitance 6 is zero. Due to the impedance characteristics of the LC resonance circuit 4 that has the optimized impedance characteristics Z and the gate-source characteristics of the FET 11 to be driven, the current is that flows in the switch 5 jumps from zero to a negative value and then gradually rises via a negative resonant peak (i.e., a local minimum value). Also, since the current i1 that flows to the LC resonance circuit 4 with the optimized impedance characteristics Z as the input current is a resonant current, the current has negative and positive maximum values (peak values) during this period. Meanwhile, the current i4 that flows to the gate electrode of the FET 11 during this period rises from a negative peak value and after this is clipped to zero and maintains this zero value until time t=t1.

Next, the operation in the period from time t1 to time t2 in FIG. 11 will be described. The driving signal voltage Vp applied to the switch 5 at time t=t1 becomes the low level to turn the switch 5 off, with this low level being maintained until time t=t2. Accordingly, the switch 5 is off from the time t1 to the time t2, and due to the impedance characteristics of the LC resonance circuit 4 that has the optimized impedance characteristics Z and the gate-source characteristics of the FET 11, the voltage V2 applied across both ends of the switch 5 from immediately after the switch 5 is turned off resonates and rises from zero with a steep gradient to an amplitude voltage that is around double the DC input voltage V1 (i.e., rises in a short time), passes three resonant peaks (a first resonant peak that is a local maximum, a second resonant peak that is a local minimum, and a third resonant peak that is a local maximum) and then falls with a steep gradient (i.e., falls in a short time) to return to zero at time t=t2, so that the derivative with respect to time (i.e., the rate of change in voltage with respect to time) also becomes zero. In other words, the switch 5 performs a Class E switching operation with high efficiency.

By turning off the switch 5 in this period, the current is that flowed in the switch 5 until this time becomes zero and there is a switch to the current ic that flows in the resonant capacitance 6. Here, the current i1 that flows as the input current to the LC resonance circuit 4 has a maximum value at time t=1 and after this reaches a minimum value at time t2 via one negative resonant peak (i.e., a resonant peak that is a local minimum) and one positive resonant peak (i.e., a resonant peak that is a local maximum). On the other hand, the current i4 that flows to the gate electrode of the FET 11 rises and resonates immediately after reaching the zero value at time t=t1 and then reaches a minimum value at time t=t2 via three resonant peaks (a first resonant peak that is a local maximum, a second resonant peak that is a local minimum, and a third resonant peak that is a local maximum). Accordingly, a current that is the difference between the current i1 and the current i4 flows to the resonant capacitance 6 as the current ic.

Also during the period from time t0 to time t2, the voltage V2 applied to both ends of the switch 5 with the voltage waveform described above has its DC component removed by the capacitance 7, is biased by the biasing circuit 8 adding the DC voltage V3, and is then outputted across the gate and source electrodes of the FET 11 via the output terminals 3a and 3b as the driving voltage V4.

The operation in the following period from time t2 to time t3 in FIG. 11 is the same as the operation in the period from time t0 to time t1 described earlier, and the operation in the next following period from time t3 to time t4 is the same as the operation in the period from time t1 to time t2 described earlier. That is, the operation during the period from time t0 to time t2 is repeated during the following periods. Note that although an example where the on time and off time of the driving signal voltage Vp used for on/off control of the switch 5 are equal has been described above, when the on time and the off time of the switch 5 differ, there are cases where the operation voltages and operation current peak times of the various components will also differ.

In this way, with the FET driving circuit 1 that is equipped with the LC resonance circuit 4 that has the optimized impedance characteristics Z with two resonant frequencies (the first resonant frequency and the second resonant frequency), by repeatedly turning the switch 5 on and off by outputting the driving signal voltage Vp to the switch 5, it is possible to output the driving voltage V4 to the gate electrode of the FET 11 with the potential of the source electrode of the FET 11 to be driven as a reference. Here, by using the LC resonance circuit 4 with the optimized impedance characteristics Z, it is possible to attenuate the second harmonic component of the switching frequency in the voltage V2 applied across both ends of the switch 5 when the switch 5 is off, and by doing so, it is possible to produce a waveform that is close to a rectangular waveform. In this way, with the FET driving circuit 1, since it is possible to lower the peak value of the voltage V2 applied to both ends of the switch 5, it is possible to use a switch with a low withstand voltage and therefore a low on-resistance, which makes it possible to significantly reduce the conduction loss and enhance the low loss effect. Also, since it is possible to reduce the peak value of the voltage V2 and in turn the driving voltage V4, it is possible to maintain a low derating for the gate voltage of the FET 11 to be driven, which makes it possible to improve the reliability of the FET 11. Also, according to the FET driving circuit 1, it is possible to shorten the time taken by the voltage V2 to rise and fall, and in turn to shorten the time taken by the driving voltage V4 to rise and fall (i.e., to steepen the voltage gradients of rises and falls). By doing so, it is possible to significantly reduce the switching loss at the switch 5, as well as the switching loss and conduction loss at the FET 11 to be driven (i.e., to drive the FET 11 to be driven with a low loss). According to the FET driving circuit 1, since a single component, the switch 5, is sufficient for the switching, compared to a configuration that uses a larger number of switches, it is possible to avoid an increase in the cost of components, an increase in the mounting cost of components, and an increase in the mounting area of components, and to also realize a simplified circuit. Also since no dead time is set to prevent cross conduction, it is possible to drive the FET at even higher frequencies. By using an externally excited configuration, it is also possible to avoid fluctuations in the switching frequency.

Next, with reference to a steady-state operation waveform diagram given in FIG. 12, the fundamental operation of the FET driving circuit 1 depicted in FIG. 1 will be described in detail for the operation waveforms in each period for a case where the LC resonance circuit 4 has the optimized impedance characteristics Z with four resonant frequencies (i.e., the first resonant frequency to the fourth resonant frequency) depicted in FIG. 2.

Out of the operation waveforms in each period, the operations in the period from time t0 to time t1 are described first. At time t=t0, a driving signal voltage Vp outputted from a control circuit that performs on/off control of the switch 5 becomes a high level to turn the switch 5 on and this high level is maintained until time t=t1. Accordingly, in the period from time t0 to time t1, the switch 5 is on, the voltage V2 applied across both ends of the switch 5 is zero, and a current is that flows to the resonant capacitance 6 is zero. Due to the impedance characteristics of the LC resonance circuit 4 that has the optimized impedance characteristics Z and the gate-source characteristics of the FET 11 to be driven, the current is that flows in the switch 5 jumps from zero to a negative value and then gradually rises via a negative resonant peak (i.e., a local minimum value). Also, since the current i1 that flows to the LC resonance circuit 4 with the optimized impedance characteristics Z as the input current is a resonant current, the current has negative and positive maximum values (peak values) during this period. Meanwhile, the current i4 that flows to the gate electrode of the FET 11 during this period rises from a negative peak value and after this is clipped to zero and maintains this zero value until time t=t1.

Next, the operation in the period from time t1 to time t2 in FIG. 12 will be described. The driving signal voltage Vp applied to the switch 5 at time t=t1 becomes the low level to turn the switch 5 off, with this low level being maintained until time t=t2. Accordingly, the switch 5 is off from the time t1 to the time t2, and due to the impedance characteristics of the LC resonance circuit 4 that has the optimized impedance characteristics Z and the gate-source characteristics of the FET 11, the voltage V2 applied across both ends of the switch 5 from immediately after the switch 5 is turned off resonates and rises from zero with a steep gradient to an amplitude voltage that is around double the DC input voltage V1 (i.e., rises in a short time), passes five resonant peaks (a first resonant peak that is a local maximum, a second resonant peak that is a local minimum, a third resonant peak that is a local maximum, a fourth resonant peak that is a local minimum, and a fifth resonant peak that is a local maximum) and then falls with a steep gradient (i.e., falls in a short time) to return to zero at time t=t2, so that the derivative with respect to time (i.e., the rate of change in voltage with respect to time) also becomes zero. In other words, the switch 5 performs a Class E switching operation.

By turning off the switch 5 in this period, the current is that flowed in the switch 5 until this time becomes zero and there is a switch to the current ic that flows in the resonant capacitance 6. Here, the current i1 that flows as the input current to the LC resonance circuit 4 has a maximum value at time t=1 and after this reaches a minimum value at time t2 via four resonant peaks (that is, a first negative resonant peak that is a local minimum, a second positive resonant peak that is a local maximum, a third negative resonant peak that is a local minimum, and a fourth positive resonant peak that is a local maximum). On the other hand, the current i4 that flows to the gate electrode of the FET 11 rises and resonates immediately after reaching the zero value at time t=t1 and then reaches a minimum value at time t=t2 via three resonant peaks (a first resonant peak that is a local maximum, a second resonant peak that is a local minimum, and a third resonant peak that is a local maximum). Accordingly, a current that is the difference between the current i1 and the current i4 flows to the resonant capacitance 6 as the current ic.

Also during the period from time t0 to time t2, the voltage V2 applied to both ends of the switch 5 with the voltage waveform described above has its DC component removed by the capacitance 7, is biased by the biasing circuit 8 adding the DC voltage V3, and is then outputted across the gate and source electrodes of the FET 11 via the output terminals 3a and 3b as the driving voltage V4.

The operation in the following period from time t2 to time t3 in FIG. 12 is the same as the operation in the period from time t0 to time t1 described earlier, and the operation in the next following period from time t3 to time t4 is the same as the operation in the period from time t1 to time t2 described earlier. That is, the operation during the period from time t0 to time t2 is repeated during the following periods. Note that although an example where the on time and off time of the driving signal voltage Vp used for on/off control of the switch 5 are equal has been described above, when the on time and the off time of the switch 5 differ, there are cases where the operation voltages and operation current peak times of the various components will also differ.

In this way, with the FET driving circuit 1 that is equipped with the LC resonance circuit 4 that has the optimized impedance characteristics Z with four resonant frequencies (the first resonant frequency to the fourth resonant frequency), by repeatedly turning the switch 5 on and off by outputting the driving signal voltage Vp to the switch 5, it is possible to output the driving voltage V4 to the gate electrode of the FET 11 with the potential of the source electrode of the FET 11 to be driven as a reference. Here, by using the LC resonance circuit 4 with the optimized impedance characteristics Z, it is possible to attenuate the second harmonic component and the fourth harmonic component of the switching frequency in the voltage V2 applied across both ends of the switch 5 when the switch 5 is off, and by doing so, it is possible to produce a waveform that is close to a rectangular waveform. In this way, with the FET driving circuit 1, since it is possible to lower the peak value of the voltage V2 applied to both ends of the switch 5, it is possible to use a switch with a low withstand voltage and therefore a low on-resistance, which makes it possible to significantly reduce the conduction loss and enhance the low loss effect. Also, since it is possible to reduce the peak value of the voltage V2 and in turn the driving voltage V4, it is possible to maintain a low derating for the gate voltage of the FET 11 to be driven, which makes it possible to improve the reliability of the FET 11. Also, according to the FET driving circuit 1, it is possible to shorten the time taken by the voltage V2 to rise and fall, and in turn to shorten the time taken by the driving voltage V4 to rise and fall (i.e., to steepen the voltage gradients of rises and falls). By doing so, it is possible to significantly reduce the switching loss at the switch 5, and to significantly reduce the switching loss and conduction loss at the FET 11 to be driven (i.e., to drive the FET 11 to be driven with a much lower loss). According to the FET driving circuit 1, since a single component, the switch 5, is sufficient for the switching, compared to a configuration that uses a larger number of switches, it is possible to avoid an increase in the cost of components, an increase in the mounting cost of components, and an increase in the mounting area of components, and to also realize a simplified circuit. Also, since no dead time for preventing cross conduction is set, it is possible to drive the FET at even higher frequencies. By using an externally excited configuration, it is also possible to avoid fluctuations in the switching frequency.

According to the FET driving circuit 1 that includes the LC resonance circuit 4 with the optimized impedance characteristics Z that include the two resonant frequencies described above and the FET driving circuit 1 that includes the LC resonance circuit 4 with the optimized impedance characteristics Z that include the four resonant frequencies described above (both of these FET driving circuits 1 are referred to hereinafter as the "FET driving circuits 1"), it is possible with the LC resonance circuit 4 to set the amplitude of the voltage V2 applied to both ends of the switch 5 to around double the DC input voltage V1, so that by changing the DC input voltage V1, it is possible to easily adjust the amplitude of the driving voltage V4 to a suitable amplitude for the FET 11 to be driven. Also, due to the amplitude of the voltage V2 being suppressed to around double the DC input voltage V1, it is possible to lower the withstand voltage of the switch 5, which makes it possible to select a switch with a low on-resistance as the switch 5. As a result, it is possible to achieve a reduction in the conduction loss (or "on loss") of the switch 5 and to further increase the low loss effect. Also, by using the LC resonance circuit 4 with the optimized impedance characteristics Z, it becomes easier to optimize high-frequency switching operations.

Also, according to the FET driving circuits 1 described above, by using a configuration where the DC component of the voltage V2 is removed at the capacitance 7 and the driving voltage V4 is generated based on the voltage V2 from which the DC component has been removed, the driving voltage V4 that is a negative voltage is applied (outputted) to the gate electrode of the FET 11 with the potential of the source electrode of the FET 11 as a reference, which means that it is possible to switch the FET 11 to the off state more reliably and faster. Note that it should be obvious that it is also possible to use a configuration where the voltage V2 is outputted as it is to the FET 11 as the driving voltage V4 without using the capacitance 7 and the biasing circuit 8.

Also, according to the FET driving circuits 1 described above, by including the biasing circuit 8 and adding the DC voltage V3 from the biasing circuit 8 to the voltage V2, from which the DC component was removed at the capacitance 7, to generate the driving voltage V4, it is possible to apply a driving voltage V4 to the gate of the FET 11 that is split between the positive direction (during an on period) and the negative direction (during an off period). Also, using the voltage value (DC bias value) of the DC voltage V3, it is possible to freely adjust the level at which the voltage is split between positive and negative.

Note that although the FET driving circuit 1 described above is configured so that the DC component of the voltage V2 is removed by connecting the capacitance 7 between one end of the switch 5 and the output terminal 3*a* or between the other end of the switch 5 and the output terminal 3*b*, it is also possible to use a configuration where the capacitance 7 is connected between both of between one end of the switch 5 and the output terminal 3*a* and between the other end of the switch 5 and the output terminal 3*b*. With this configuration, it becomes possible to isolate (in DC terms) the potentials of the switch 5 and the potentials of the output terminals 3*a* and 3*b*, so that although not illustrated, it is possible for example to generate and output a driving voltage V4 that is isolated (in DC terms) to drive a high-potential-side FET out of two FET that are connected in series (i.e., two FET connected in series with the source electrode of the high-potential-side FET connected to the drain electrode of the low-potential-side FET).

Moreover, the invention encompasses any possible combination of some or all of the various embodiments and the modification examples described herein and incorporated herein.

It is possible to achieve at least the following configurations from the above-described example embodiments and the modification examples of the disclosure.

(1) A FET driving circuit comprising
two direct current (DC) input terminals that are positive and negative and into which a DC voltage is inputted;
two output terminals connected to a gate electrode and a source electrode of a FET to be driven;
a switch with two ends;
a resonant capacitance connected across both ends of the switch; and
an LC resonance circuit connected in series with the switch across the DC input terminals,
wherein a voltage generated across both ends of the switch during a switching operation is outputted across the two output terminals as a driving voltage for the FET,
the LC resonance circuit has a first connector that is connected to one DC input terminal out of the two DC input terminals and a second connector that is connected to the switch,
the LC resonance circuit is configured as a single-terminal-pair network in which a current path including an inductance and a current path including a series circuit composed of an inductance and a capacitance are formed between the first connector and the second connector,
in the LC resonance circuit, frequency characteristics of an impedance between the first connector and the second connector have two resonant frequencies,
a first resonant frequency that is a lower frequency out of the two resonant frequencies is higher than a switching frequency of the switch and the impedance has a local maximum at the first resonant frequency, and
a second resonant frequency that is a higher frequency out of the two resonant frequencies is around double the switching frequency and the impedance has a local minimum at the second resonant frequency.

(2) The FET driving circuit according to (1),
wherein the LC resonance circuit is configured so that the frequency characteristics of the impedance have a further two resonant frequencies that are higher than the second resonant frequency, the impedance has a local maximum at a third resonant frequency that is a lower frequency out of the further two resonant frequencies, a fourth resonant frequency that is a higher frequency out of the further two resonant frequencies is around four times the switching frequency, and the impedance has a local minimum at the fourth resonant frequency.

(3) The FET driving circuit according to (1),
wherein the LC resonance circuit internally includes a first inductance, a second inductance, and a first capacitance,
the first inductance is connected between the first connector and the second connector, and
the second inductance and the first capacitance are connected in series between the first connector and the second connector.

(4) The FET driving circuit according to (1),
wherein the LC resonance circuit internally includes a third inductance, a fourth inductance, and a second capacitance, the third inductance and the fourth inductance are connected in series between the first connector and the second connector, and the second capacitance is connected in parallel to the fourth inductance.

(5) The FET driving circuit according to (2), wherein the LC resonance circuit internally includes a fifth inductance, a sixth inductance, a seventh inductance, a third capacitance, and a fourth capacitance, the fifth inductance is connected between the first connector and the second connector, the sixth inductance and the third capacitance are connected in series between the first connector and the second connector, and the seventh inductance and the fourth capacitance are connected in series between the first connector and the second connector.

(6) The FET driving circuit according to (2), wherein the LC resonance circuit internally includes an eighth inductance, a ninth inductance, a tenth inductance, a fifth capacitance, and a sixth capacitance, the eighth inductance, the ninth inductance, and the tenth inductance are connected in series between the first connector and the second connector, the fifth capacitance is connected in parallel to the ninth inductance, and the sixth capacitance is connected in parallel to the tenth inductance.

(7) The FET driving circuit according to (2), wherein the LC resonance circuit internally includes an eleventh inductance, a twelfth inductance, a thirteenth inductance, a seventh capacitance, and an eighth capacitance, the eleventh inductance, the twelfth inductance, and the thirteenth inductance are connected in order in series between the first connector and the second connector, the seventh capacitance is connected in parallel to a series circuit composed of the twelfth inductance and the thirteenth inductance, and the eighth capacitance is connected in parallel to the thirteenth inductance.

(8) The FET driving circuit according to (2), wherein the LC resonance circuit internally includes a fourteenth inductance, a fifteenth inductance, a sixteenth inductance, a ninth capacitance, and a tenth capacitance, the fourteenth inductance is connected between the first connector and the second connector, the ninth capacitance, the tenth capacitance, and the sixteenth inductance are connected in order in series between the first connector and the second connector, and the fifteenth inductance is connected in parallel to a series circuit composed of the tenth capacitance and the sixteenth inductance.

(9) The FET driving circuit according to (2), wherein the LC resonance circuit internally includes a seventeenth inductance, an eighteenth inductance, a nineteenth inductance, an eleventh capacitance, and a twelfth capacitance, the seventeenth inductance, the eleventh capacitance, and the eighteenth inductance are connected in order in series between the first connector and the second connector, the nineteenth inductance is connected in parallel to a series circuit composed of the eleventh capacitance and the eighteenth inductance, and the twelfth capacitance is connected in parallel to the eighteenth inductance.

(10) The FET driving circuit according to (2), wherein the LC resonance circuit internally includes a twentieth inductance, a twenty-first inductance, a twenty-second inductance, a thirteenth capacitance, and a fourteenth capacitance, the twentieth inductance, the thirteenth capacitance, and the twenty-first inductance are connected in order in series between the first connector and the second connector, and the twenty-second inductance and the fourteenth capacitance are respectively connected in parallel to a series circuit composed of the thirteenth capacitance and the twenty-first inductance.

(11) The FET driving circuit according to any one of (1) to (10), wherein the LC resonance circuit internally includes inductances that are magnetically coupled.

(12) The FET driving circuit according to any one of (1) to (11), wherein the switch performs a Class E switching operation.

(13) The FET driving circuit according to any one of (1) to (12), wherein a DC-cutting capacitance is connected to at least one of a path that connects one end of the switch and one output terminal out of the two output terminals and a path that connects another end of the switch and another output terminal out of the two output terminals.

(14) The FET driving circuit according to (13), wherein the DC-cutting capacitance is connected to both of the path that connects the one end of the switch and the one output terminal out of the two output terminals and the path that connects the other end of the switch and the other output terminal out of the two output terminals.

(15) The FET driving circuit according to (13) or (14), wherein a biasing circuit that applies a DC bias to the driving voltage is connected across the two output terminals.

What is claimed is:

1. A FET driving circuit comprising
two direct current (DC) input terminals that are positive and negative and into which a DC voltage is inputted;
two output terminals connected to a gate electrode and a source electrode of a FET to be driven;
a switch with two ends;
a resonant capacitance connected across both ends of the switch; and
an LC resonance circuit connected in series with the switch across the DC input terminals,
wherein a voltage generated across both ends of the switch during a switching operation is outputted across the two output terminals as a driving voltage for the FET,
the LC resonance circuit has a first connector that is connected to one DC input terminal out of the two DC input terminals and a second connector that is connected to the switch,
the LC resonance circuit is configured as a single-terminal-pair network in which a current path including an inductance and a current path including a series circuit composed of an inductance and a capacitance are formed between the first connector and the second connector,
in the LC resonance circuit, frequency characteristics of an impedance between the first connector and the second connector have two resonant frequencies,
a first resonant frequency that is a lower frequency out of the two resonant frequencies is higher than a switching frequency of the switch and the impedance has a local maximum at the first resonant frequency, and a second resonant frequency that is a higher frequency out of the two resonant frequencies is around double the switching frequency and the impedance has a local minimum at the second resonant frequency.

2. The FET driving circuit according to claim 1, wherein the LC resonance circuit is configured so that the frequency characteristics of the impedance have a further two resonant frequencies that are higher than the second resonant frequency, the impedance has a local maximum at a third resonant frequency that is a lower frequency out of the further two resonant frequencies, a fourth resonant frequency that is a higher frequency out of the further two resonant frequencies is around four times the switching frequency, and the impedance has a local minimum at the fourth resonant frequency.

3. The FET driving circuit according to claim 1, wherein the LC resonance circuit internally includes a first inductance, a second inductance, and a first capacitance,
the first inductance is connected between the first connector and the second connector, and
the second inductance and the first capacitance are connected in series between the first connector and the second connector.

4. The FET driving circuit according to claim 1, wherein the LC resonance circuit internally includes a third inductance, a fourth inductance, and a second capacitance,
the third inductance and the fourth inductance are connected in series between the first connector and the second connector, and
the second capacitance is connected in parallel to the fourth inductance.

5. The FET driving circuit according to claim 2, wherein the LC resonance circuit internally includes a fifth inductance, a sixth inductance, a seventh inductance, a third capacitance, and a fourth capacitance,
the fifth inductance is connected between the first connector and the second connector,
the sixth inductance and the third capacitance are connected in series between the first connector and the second connector, and
the seventh inductance and the fourth capacitance are connected in series between the first connector and the second connector.

6. The FET driving circuit according to claim 2, wherein the LC resonance circuit internally includes an eighth inductance, a ninth inductance, a tenth inductance, a fifth capacitance, and a sixth capacitance,
the eighth inductance, the ninth inductance, and the tenth inductance are connected in series between the first connector and the second connector,
the fifth capacitance is connected in parallel to the ninth inductance, and
the sixth capacitance is connected in parallel to the tenth inductance.

7. The FET driving circuit according to claim 2, wherein the LC resonance circuit internally includes an eleventh inductance, a twelfth inductance, a thirteenth inductance, a seventh capacitance, and an eighth capacitance,
the eleventh inductance, the twelfth inductance, and the thirteenth inductance are connected in order in series between the first connector and the second connector,
the seventh capacitance is connected in parallel to a series circuit composed of the twelfth inductance and the thirteenth inductance, and
the eighth capacitance is connected in parallel to the thirteenth inductance.

8. The FET driving circuit according to claim 2, wherein the LC resonance circuit internally includes a fourteenth inductance, a fifteenth inductance, a sixteenth inductance, a ninth capacitance, and a tenth capacitance,
the fourteenth inductance is connected between the first connector and the second connector,
the ninth capacitance, the tenth capacitance, and the sixteenth inductance are connected in order in series between the first connector and the second connector, and
the fifteenth inductance is connected in parallel to a series circuit composed of the tenth capacitance and the sixteenth inductance.

9. The FET driving circuit according to claim 2, wherein the LC resonance circuit internally includes a seventeenth inductance, an eighteenth inductance, a nineteenth inductance, an eleventh capacitance, and a twelfth capacitance,
the seventeenth inductance, the eleventh capacitance, and the eighteenth inductance are connected in order in series between the first connector and the second connector,
the nineteenth inductance is connected in parallel to a series circuit composed of the eleventh capacitance and the eighteenth inductance, and
the twelfth capacitance is connected in parallel to the eighteenth inductance.

10. The FET driving circuit according to claim 2, wherein the LC resonance circuit internally includes a twentieth inductance, a twenty-first inductance, a twenty-second inductance, a thirteenth capacitance, and a fourteenth capacitance,
the twentieth inductance, the thirteenth capacitance, and the twenty-first inductance are connected in order in series between the first connector and the second connector, and
the twenty-second inductance and the fourteenth capacitance are respectively connected in parallel to a series circuit composed of the thirteenth capacitance and the twenty-first inductance.

11. The FET driving circuit according to claim 1, wherein the LC resonance circuit internally includes inductances that are magnetically coupled.

12. The FET driving circuit according to claim 1, wherein the switch performs a Class E switching operation.

13. The FET driving circuit according to claim 1, wherein a DC-cutting capacitance is connected to at least one of a path that connects one end of the switch and one output terminal out of the two output terminals and a path that connects another end of the switch and another output terminal out of the two output terminals.

14. The FET driving circuit according to claim 13, wherein the DC-cutting capacitance is connected to both of the path that connects the one end of the switch and the one output terminal out of the two output terminals and the path that connects the other end of the switch and the other output terminal out of the two output terminals.

15. The FET driving circuit according to claim 13,
wherein a biasing circuit that applies a DC bias to the driving voltage is connected across the two output terminals.

16. The FET driving circuit according to claim 14,
wherein a biasing circuit that applies a DC bias to the driving voltage is connected across the two output terminals.

* * * * *